(12) United States Patent  
Teterwak

(10) Patent No.: US 8,816,889 B2  
(45) Date of Patent: Aug. 26, 2014

(54) CURRENT-STEERING DIGITAL-TO-ANALOG CONVERTER WITH CANCELLATION OF DYNAMIC DISTORTION

(71) Applicant: Maxim Integrated Products, Inc., San Jose, CA (US)

(72) Inventor: Jerzy Antoni Teterwak, Colorado Springs, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/718,434

(22) Filed: Dec. 18, 2012

(65) Prior Publication Data

US 2014/0167996 A1    Jun. 19, 2014

(51) Int. Cl.
    *H03M 1/66* (2006.01)
(52) U.S. Cl.
    USPC ............................ 341/144; 341/145; 341/122
(58) Field of Classification Search
    USPC .................. 341/144, 172, 145, 150, 118, 120
    See application file for complete search history.

(56) References Cited

U.S. PATENT DOCUMENTS

| | | | | |
|---|---|---|---|---|
| 5,689,258 A * | 11/1997 | Nakamura et al. | ............ | 341/136 |
| 7,098,829 B2 * | 8/2006 | Westra | .......... | 341/144 |
| 7,443,219 B2 * | 10/2008 | Rausch | .......... | 327/231 |
| 7,679,538 B2 * | 3/2010 | Tsang | .......... | 341/144 |
| 8,350,741 B2 * | 1/2013 | Steinbach | ...... | 341/144 |

* cited by examiner

*Primary Examiner* — Peguy Jean Pierre

(57) ABSTRACT

A digital-to-analog converter (DAC) includes, in a segment of the DAC, a first switch and a second switch. The first switch includes a first pair of transistors having a first set of inputs and has a first output connected to an output of the DAC. The second switch includes second and third pairs of transistors having second and third sets of inputs, respectively, and has a second output that is connected to the output of the DAC. A driver module generates control signals to drive the first, second, and third sets of inputs based on data received by the DAC for conversion from digital to analog format at a conversion rate determined by a clock. The control signals toggle one of the first and second switches during each cycle of the clock.

18 Claims, 5 Drawing Sheets

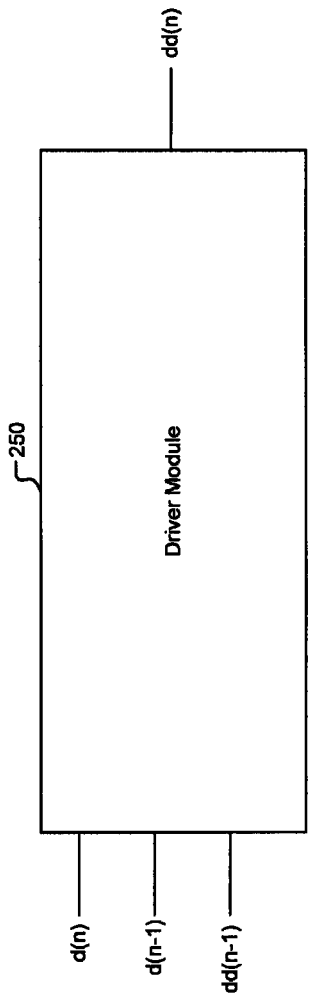
FIG. 4A
FIG. 4B
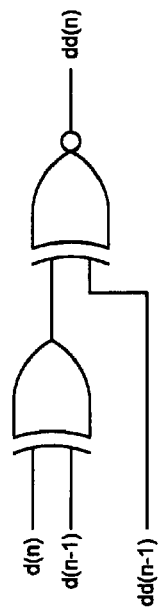
FIG. 4C
| d(n) | d(n-1) | dd(n-1) | dd(n) |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 1 | 1 |
| 1 | 1 | 1 | 0 |

…

CURRENT-STEERING DIGITAL-TO-ANALOG CONVERTER WITH CANCELLATION OF DYNAMIC DISTORTION

FIELD

The present disclosure relates generally to digital-to-analog converters (DACs) and more particularly to high-speed, high dynamic performance current-steering DACs.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital-to-analog converters (DACs) are used to convert digital data into analog data. DACs are used in many applications including communication systems. A thermometer-coded DAC includes an equal current-source segment for each possible value of DAC output. For example, an 8-bit thermometer-coded DAC would have 255 segments, and a 16-bit thermometer-coded DAC would have 65,535 segments.

SUMMARY

A digital-to-analog converter (DAC) includes, in a segment of the DAC, a first switch and a second switch. The first switch includes a first pair of transistors having a first set of inputs and has a first output connected to an output of the DAC. The second switch includes second and third pairs of transistors having second and third sets of inputs, respectively, and has a second output that is connected to the output of the DAC. A driver module generates control signals to drive the first, second, and third sets of inputs based on data received by the DAC for conversion from digital to analog format at a conversion rate determined by a clock. The control signals toggle one of the first and second switches during each cycle of the clock.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A-4C depict a driver module that drives the main switch and the auxiliary switch in a segment of the DAC such that the main switch or the auxiliary switch is toggled in each clock cycle to cancel harmonic distortion in the DAC.

In the drawings, reference numbers may be reused to identify similar and/or identical elements.

DETAILED DESCRIPTION

In many communication systems, it is desirable that a digital-to-analog converter (DAC) produces signals with acceptable harmonic distortion. Producing signals with acceptable harmonic distortion is particularly desirable when the DAC is used in a communication system designed to meet specific requirements set forth in one or more communication standards. There are some effects in current-steering DACs that intrinsically limit dynamic performance. The present disclosure relates to DAC architecture that cancels dominant distortion effects in high-speed current steering DACs.

More specifically, the present disclosure relates to cancellation of dynamic distortion in high-speed DACs using a segment switch architecture that cancels transient effects responsible for generating third-order distortion. The architecture disclosed herein also results in constant switching activity in a DAC current switch array, which reduces distortion generated by voltage drops in DAC power supply network.

As used herein, constant switching activity in a segment means that switching occurs in a segment during each clock cycle irrespective of whether data requires toggling the switch in the segment. More specifically, as explained below in detail, in a segment, either the main switch or an auxiliary switch added according to the present disclosure is toggled in each clock cycle regardless of whether the data requires toggling the main switch.

Figure 1:
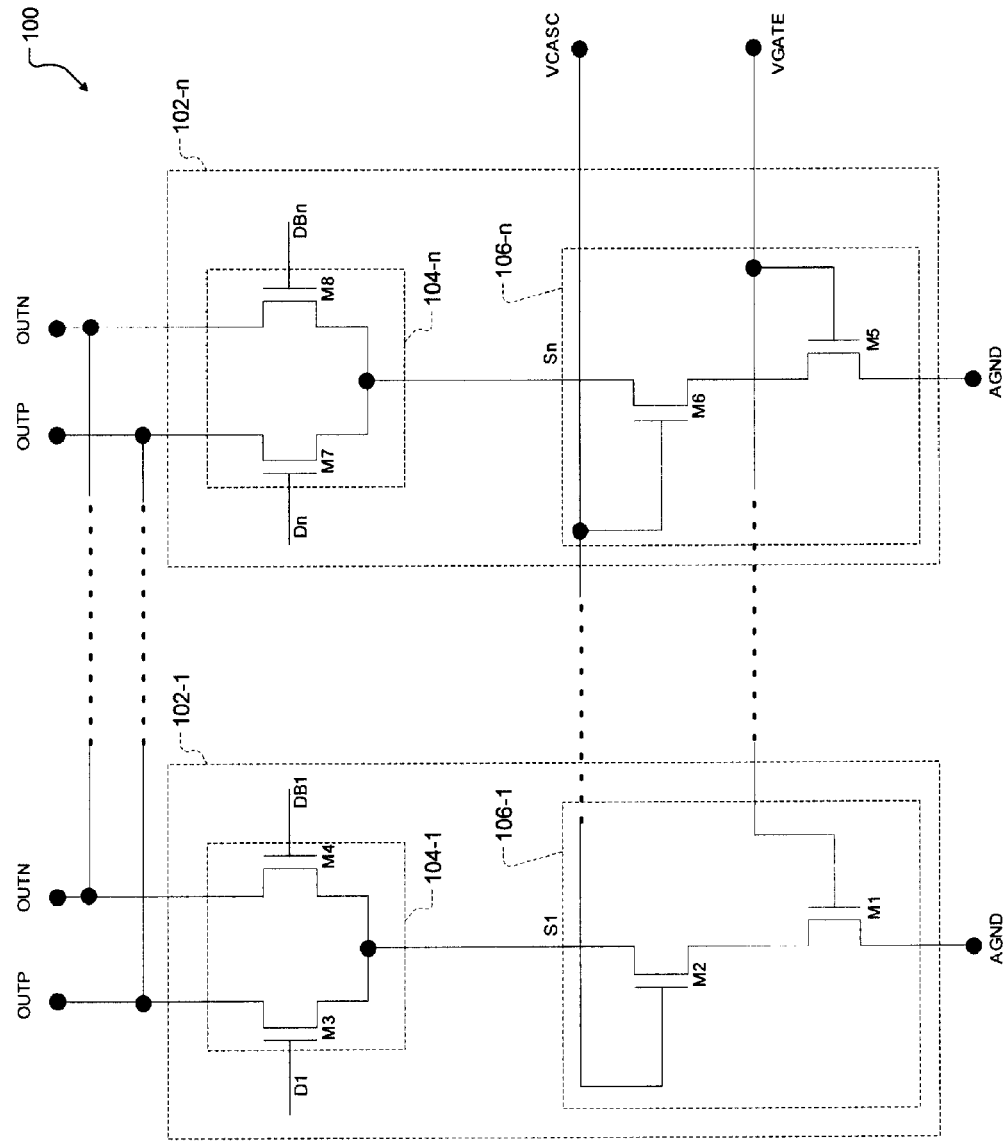
FIG. 1 is a schematic of a segmented current-steering digital-to-analog converter (DAC)

Referring now to FIG. 1, a current-steering DAC 100 is shown. The DAC 100 includes a plurality of differential segments 102-1, . . . , and 102-n (collectively segments 102). Each segment 102 includes a pair of differential switches that steer an output of a current source to a negative or a positive output of the DAC 100. For example, the segment 102-1 includes a pair of differential switches 104-1 that steer an output of a current source 106-1 to the negative or the positive output of the DAC 100; and so on. The segment 102-n includes a pair of differential switches 104-n that steer an output of a current source 106-n to the negative or the positive output of the DAC 100. The pairs of differential switches 104-1, . . . , and 104-n are collectively called switches 104. The current sources 106-1, . . . , and 106-n are collectively called current sources 106. For example only, the transistors shown are NMOS transistors.

The switches 104 in the segments 102 are controlled by a binary-to-thermometer code decoder (not shown). As the input code increases, less current is directed to the negative output, and more current flows to the positive output. In most applications, the output signal is received in a differential mode. In the differential mode, the output current is equal to a difference between the current in the positive and negative converter output. The differential output configuration helps suppress even-order harmonics and increases output signal power.

In a fully segmented DAC, the number of segment switches is equal to $2^N-1$, where N is the converter resolution in bits. In practice, the number of main segments is usually limited to 32 or 64, and the desired (higher) resolution is achieved by adding segmented or binary-weighted sub-DACs.

One of the dynamic characteristics of a high-speed DAC is a Spurious Free Dynamic Range (SFDR) of the DAC. The SFDR is usually determined by a third-order distortion. The third-order distortion is also responsible for generating close-in intermodulation components, which should have low-level in many communications applications. Two dominant effects that inherently limit the third-order distortion performance of the DAC are related to variation of summing node potential of a switch and to an instantaneous drop in an output impedance of the switch.

Figure 2:
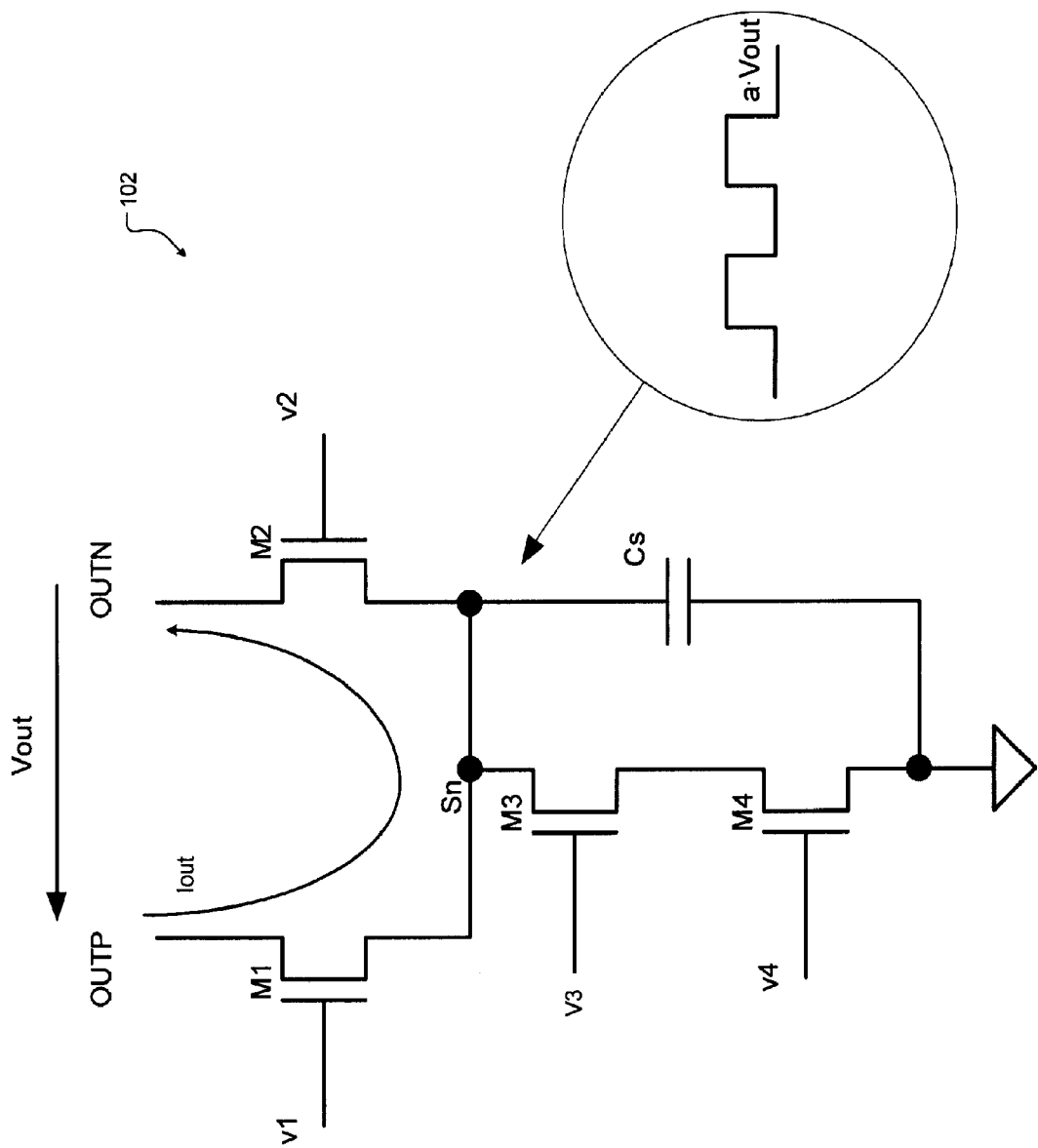
FIG. 2 depicts a segment of the DAC of FIG. 1.

Referring now to FIG. 2, the two effects are explained in detail. During a transition, a potential at node Sn shifts, the capacitance Cs is recharged, and current flowing through the capacitance Cs affects the DAC output. Also, during the transition, an output impedance of the switch drops instantaneously. Both these effects create an error current proportional to an absolute value of a derivative of the output signal of the DAC. The error current causes in third-order dynamic distortion.

The first effect, the variation of summing node potential of a switch 104, is caused by a finite intrinsic gain of transistors in the switch 104. When the switch 104 is toggled, the potential at node Sn shifts proportionally to a potential difference between the positive and the negative output of the DAC 100. The shift in potential at the node Sn causes a capacitance Cs at the node Sn to recharge. The charge flowing through the capacitance Cs affects the output current and depends on the signal. Thus, the shift in potential at the node Sn creates harmonic distortion.

The second effect is related to the fact that both transistors in a switch are active during the gate voltage transition causing the summing node Sn to become a low-impedance node. During that time, the output impedance of the switch, measured differentially, is equal to $2/g_{ds}$, where $g_{ds}$ is an output conductance of the transistors in the switch. The output impedance is much lower than when the transistors in the switch are fully switched. The output impedance of the fully switched transistor pair is determined by a cascode connection of transistors M1, M3 and M4. The output impedance of the fully switched transistor pair is significantly greater than $2/g_{ds}$.

While these two effects are different in nature, they affect the DAC operation in a similar way. They can be modeled by a variable conductance connected across the positive and the negative DAC output. The conductance is proportional to the segment switching activity, which implies that the conductance is also proportional to the absolute value of the derivative of the DAC output signal. This type of dependence on input data creates third-order harmonics in the DAC output spectrum, which are undesirable in some applications such as communication systems.

The two transient effects described above cause distortion because the switching activity is signal-dependent. More specifically, segment switching causes distortion because the switching activity is proportional to the absolute value of the derivative of the DAC output signal. If the segment switching activity were constant, and independent of the output signal, no distortion would be created. Accordingly, the distortion can be eliminated by making the switching activity constant and independent of the DAC output signal.

Figure 3:
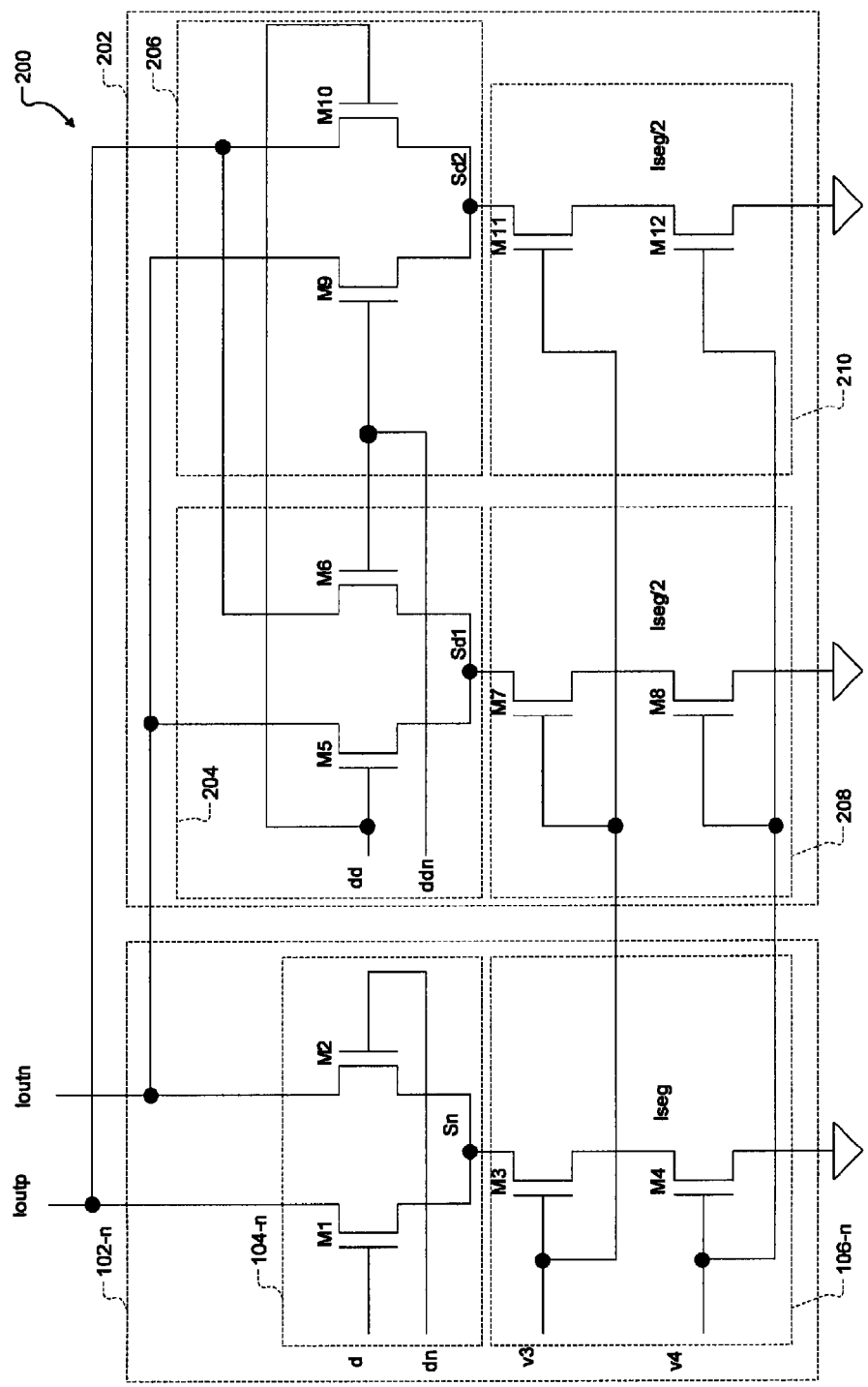
FIG. 3 is a schematic of a segment of a current-steering DAC that includes a main switch and an auxiliary switch in the segment, where the main switch or the auxiliary switch is toggled in each clock cycle to cancel harmonic distortion in the DAC.

Referring now to FIG. 3, a segment 200 of a DAC according to the present disclosure is shown. For clarity, only one segment is shown. Ideally, each segment of a DAC can be designed similar to the segment 200. In practice, only segments corresponding to higher-order bits (e.g., MSBs) can be designed similar to the segment 200 since the distortion created by segments corresponding to lower-order bits (e.g., LSBs) may be negligible.

The segment 200 makes the switching activity constant and independent of the DAC output signal as follows. The segment 200 includes a main switch 104-n and an auxiliary switch 202. The auxiliary switch 202 includes two differential pairs (i.e., a pair of differential switches) 204 and 206 respectively connected to current sources 208 and 210. Each of the switches 204 and 206 is half the size of the main switch 104-n. Each of the switches 204 and 206 conducts half of the segment current. The two differential pairs in the dummy switch are cross-connected in such a way that the DAC output current does not change when the auxiliary switch 202 is toggled.

The main switch 104-n and an auxiliary switch 202 are driven in such a way that in each clock cycle one and only one switch in the main-auxiliary pair is toggled. Specifically, in each clock cycle, the main switch 104-n is static (i.e., is not toggled) if the auxiliary switch 202 is toggled, and the auxiliary switch 202 is static (i.e., is not toggled) if the main switch 104-n is toggled.

The auxiliary switch 202 does not change the DAC output current. The auxiliary switch 202 creates exactly the same transient as the main switch 104-n. This results in the switching activity in the segment 200 being constant and independent of the output signal. As a result, no distortion is created. The constant switching activity also provides an added benefit of creating only signal independent voltage drops across the power supply network.

Referring now to FIGS. 4A and 4B, an example of a driver module 250 that can be used to drive the main switch 104-n and the auxiliary switch 202 such that in each clock cycle one and only one switch in the main-auxiliary pair is toggled. A general driver module 250 is shown in FIG. 4A. An example of a specific implementation of the driver module 250 is shown in FIG. 4B. In FIGS. 4A and 4B, d(n) and dd(n) indicate states of inputs at nth clock cycle, and d(n−1) and dd(n−1) indicate states of the inputs at (n−1)th clock cycle. Accordingly, dd(n) is generated based on an XNOR of (i) dd(n−1) and (ii) an XOR of d(n) and d(n−1). FIG. 4C shows a truth-table for the driver module 250.

Figure 5:
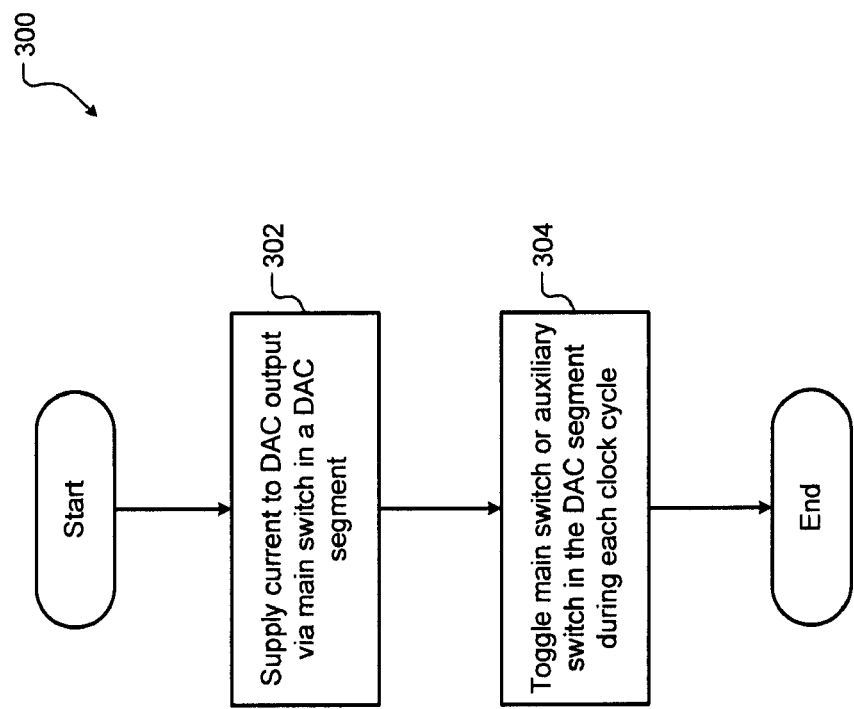
FIG. 5 is a flowchart of a method for canceling harmonic distortion in the DAC.

Referring now to FIG. 5, a method 300 for canceling harmonic distortion in a current-steering DAC is shown. While the method shown describes operation for only one segment of the DAC, the operation can be extended to any number of segments of the DAC. At 302, control operates a main switch in a segment of the DAC and supplies current to DAC output via the main switch. At 304, control toggles the main switch or an auxiliary switch in the segment during each clock cycle. The auxiliary switch creates the same transients as the main switch, which cancels the harmonic distortion in the DAC output without changing current supplied to the DAC output.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A digital-to-analog converter (DAC) comprising:
    a segment of the DAC comprising:
        a first switch comprising a first pair of transistors having a first set of inputs, wherein the first switch has a first output connected to an output of the DAC; and
        a second switch comprising second and third pairs of transistors respectively having second and third sets of inputs, wherein the second switch has a second output that is connected to the output of the DAC; and
    a driver module that generates control signals to drive the first, second, and third sets of inputs based on data received by the DAC for conversion from digital to analog format at a conversion rate determined by a clock, wherein the control signals toggle one of the first and second switches during each cycle of the clock.

2. The DAC of claim 1, wherein the first and second switches respectively generate first and second transients when the first and second switches toggle, and wherein the first and second transients are independent of the output of the DAC.

3. The DAC of claim 1, wherein the first and second switches respectively generate first and second transients when the first and second switches toggle, and wherein the first and second transients reduce harmonic distortion in the output of the DAC.

4. The DAC of claim 1, wherein the second and third pairs of transistors are half the size of the first pair of transistors.

5. The DAC of claim 1, wherein each of the second and third pairs of transistors conducts half the current conducted by the first pair of transistors.

6. The DAC of claim 1, wherein the first switch supplies a first current to the output of the DAC, and wherein the first current is unchanged when the second switch toggles.

7. The DAC of claim 1, further comprising:
    a first current source that generates a first current and that is connected to the first pair of transistors;
    a second current source that generates a second current and that is connected to the second pair of transistors; and
    a third current source that generates a third current and that is connected to the third pair of transistors,
    wherein the second and third currents are half of the first current.

8. A digital-to-analog converter (DAC) comprising:
    a segment of the DAC comprising:
        a first switch comprising first and second transistors each having first, second, and third terminals, wherein the first terminals are respectively connected to first and second outputs of the DAC, second terminals are connected to a first current source, and the third terminals receive first inputs; and
        a second switch comprising third, fourth, fifth, and sixth transistors each having first, second, and third terminals, wherein the first terminals of the third and fifth transistors are connected to the first output of the DAC, the second terminals of the third and fifth transistors are connected to a second current source, the first terminals of the fourth and sixth transistors are connected to the second output of the DAC, the second terminals of the fourth and sixth transistors are connected to a third current source, the third terminals of the third and sixth transistors receive a third input, and the third terminals of the fourth and fifth transistors receive a third input; and
    a driver module that generates the first, second, and third inputs based on data received by the DAC for conversion from digital to analog format at a conversion rate determined by a clock, wherein the first inputs and the second and third inputs toggle one of the first and second switches during each cycle of the clock.

9. The DAC of claim 8, wherein the first and second switches respectively generate first and second transients when the first and second switches toggle, and wherein the first and second transients are independent of the output of the DAC.

10. The DAC of claim 8, wherein the first and second switches respectively generate first and second transients when the first and second switches toggle, and wherein the first and second transients reduce harmonic distortion in the output of the DAC.

11. The DAC of claim 8, wherein the third, fourth, fifth, and sixth transistors are half the size of the first and second transistors.

12. The DAC of claim 8, wherein the third and fourth transistors conduct half the current conducted by the first and second transistors, and wherein the fifth and sixth transistors conduct half the current conducted by the first and second transistors.

13. The DAC of claim 8, wherein the first switch supplies a first current to the output of the DAC, and wherein the first current is unchanged when the second switch toggles.

14. The DAC of claim 8, further comprising:
    the first current source that generates a first current;
    the second current source that generates a second current; and
    the third current source that generates a third current,
    wherein the second and third currents are half of the first current.

15. A method comprising:
supplying a first current to an output of digital-to-analog converter (DAC) by controlling a first switch in a segment of the DAC;
controlling a second switch that is connected in parallel to the first switch in the segment of the DAC and that is connected to the output of the DAC;
generating control signals to control the first and second switches based on data received by the DAC for conversion from digital to analog format at a conversion rate determined by a clock; and
toggling one of the first and second switches during each cycle of the clock,
wherein the first and second switches respectively generate first and second transients when the first and second switches toggle, and wherein the first and second transients are independent of the output of the DAC.

16. A method comprising:
supplying a first current to an output of digital-to-analog converter (DAC) by controlling a first switch in a segment of the DAC;
controlling a second switch that is connected in parallel to the first switch in the segment of the DAC and that is connected to the output of the DAC;
generating control signals to control the first and second switches based on data received by the DAC for conversion from digital to analog format at a conversion rate determined by a clock; and
toggling one of the first and second switches during each cycle of the clock,
wherein the first and second switches respectively generate first and second transients when the first and second switches toggle, and wherein the first and second transients reduce harmonic distortion in the output of the DAC.

17. The method of claim 15, further comprising supplying a first current to the output of the DAC via the first switch, wherein the first current is unchanged when the second switch toggles.

18. The method of claim 16, further comprising supplying a first current to the output of the DAC via the first switch, wherein the first current is unchanged when the second switch toggles.

* * * * *